United States Patent
Huber et al.

(10) Patent No.: US 6,785,310 B2
(45) Date of Patent: Aug. 31, 2004

(54) DIODE LASER DEVICE WITH COOLING AND OPERATION MONITORING

(75) Inventors: Rudolf Huber, Trossingen (DE); Martin Huonker, Oehningen (DE); Thomas Konrad Notheis, Schramberg (DE); Klaus Wallmeroth, Zimmern (DE)

(73) Assignee: Trumpf Laser GmbH + Co. KG, Schramberg (DE)

(*) Notice: Subject to any disclaimer, the term of this patent is extended or adjusted under 35 U.S.C. 154(b) by 0 days.

(21) Appl. No.: 10/268,220

(22) Filed: Oct. 9, 2002

(65) Prior Publication Data

US 2003/0043867 A1 Mar. 6, 2003

Related U.S. Application Data

(63) Continuation of application No. PCT/EP01/03165, filed on Mar. 20, 2001.

(30) Foreign Application Priority Data

Apr. 13, 2000 (DE) .......................................... 100 18 421

(51) Int. Cl.[7] .............................. H01S 3/04; H01S 3/10
(52) U.S. Cl. ................................... 372/34; 372/29.015
(58) Field of Search ........................ 372/29.015, 33–36

(56) References Cited

U.S. PATENT DOCUMENTS

| | | | | |
|---|---|---|---|---|
| 5,105,429 A | * | 4/1992 | Mundinger et al. | ........... 372/34 |
| 5,105,430 A | * | 4/1992 | Mundinger et al. | ........... 372/35 |
| 5,495,490 A | * | 2/1996 | Rice et al. | ..................... 372/34 |
| 5,579,328 A | | 11/1996 | Habel et al. | |
| 5,734,672 A | * | 3/1998 | McMinn et al. | ............... 372/50 |
| 6,101,206 A | | 8/2000 | Apollonov et al. | |
| 6,151,341 A | * | 11/2000 | Bull et al. | ..................... 372/35 |
| 6,330,259 B1 | * | 12/2001 | Dahm | .......................... 372/35 |

FOREIGN PATENT DOCUMENTS

| | | |
|---|---|---|
| DE | 40 10 054 | 10/1991 |
| EP | 0 425 309 | 5/1991 |
| WO | WO 98/15041 | 4/1998 |

* cited by examiner

*Primary Examiner*—Quyen Leung
*Assistant Examiner*—Hung T Vy
(74) *Attorney, Agent, or Firm*—Barry R. Lipsitz; Douglas M. McAllister

(57) ABSTRACT

To improve a diode laser device comprising at least one laser diode, a power supply for the laser diode, a cooling device including a heat sink with the laser diode disposed thereon, and a coolant supply allowing a coolant to flow through the heat sink, so that simple monitoring of its operation is possible without interfering with use of the diode laser device, it is proposed that an operation monitoring device be provided, and that the operation monitoring device detect a quantity representing the electric current flowing through the laser diode and a quantity representing the temperature of the coolant exiting from the heat sink and determine from these an operational quantity representing operation of the diode laser device.

18 Claims, 3 Drawing Sheets

# DIODE LASER DEVICE WITH COOLING AND OPERATION MONITORING

This application is a continuation of international application number PCT/EP01/03165 filed on Mar. 20, 2001.

The present disclosure relates to the subject matter disclosed in international application PCT/EP01/03165 of Mar. 20, 2001, which is incorporated herein by reference in its entirety and for all purposes.

BACKGROUND OF THE INVENTION

The invention relates to a diode laser device comprising at least one laser diode, a power supply for the laser diode, a cooling device including a heat sink with the laser diode disposed thereon, and a coolant supply allowing a coolant to flow through the heat sink.

Such diode laser devices are known from the prior art. The problem with these is that it is only possible to check whether they are operating properly by measuring the emitted laser radiation with calorimetric measuring instruments or devices for measuring the optical power, and, depending on the configuration, measurement of the optical power may prove problematic.

This requires arrangement of a corresponding measuring head in the radiation path of the laser radiation, with the result that the diode laser device cannot be used for its intended purpose, for example, for pumping a solid-state laser during the measuring.

The object underlying the invention is, therefore, to so improve a diode laser device of the generic kind that simple monitoring of the operation is possible without interfering with use of the diode laser device.

SUMMARY OF THE INVENTION

This object is accomplished with a diode laser device of the kind described at the outset, in accordance with the invention, in that an operation monitoring device is provided, and in that the operation monitoring device detects a quantity representing the electric current flowing through the laser diode and a quantity representing the temperature of the coolant exiting from the heat sink and determines from these an operational quantity representing operation of the diode laser device.

The advantage of the solution according to the invention is that the operational quantity can be determined without interrupting the radiation path of the laser radiation, and, consequently, also while the diode laser device is being used for its intended purpose, for example, for pumping a solid-state laser.

The solution according to the invention has the further great advantage that determination of the operational quantity can be carried out with simple means, as merely determination of the quantity representing the current flowing through the laser diode and the quantity representing the temperature of the coolant exiting from the heat sink is required, and these can be detected with simple means.

A multiplicity of direct and indirect methods are conceivable for detecting the quantity representing the temperature of the coolant exiting from the heat sink. If, for example, the coolant exiting from the heat sink is cooled to a certain temperature, it is conceivable to detect the cooling power required for the cooling.

For reasons of simplicity, however, it is particularly advantageous for the operation monitoring device to detect the temperature of the coolant exiting from the heat sink by means of a sensor.

For even more precise determination of the operational quantity, it has proven advantageous for the operation monitoring device to determine a quantity representing the temperature difference between the coolant entering the heat sink and the coolant exiting from the heat sink.

Such determination of the quantity representing the temperature difference can be carried out, for example, indirectly by determining the cooling power required for reaching a specified temperature for the coolant entering the heat sink.

It is, however, particularly simple for the operation monitoring device to detect the temperature of the coolant entering the heat sink by means of a sensor.

In principle, the operational quantity can be determined with sufficient precision on the basis of the temperature measurements, but the precision can be further increased by the operation monitoring device detecting the flow rate of the coolant through the heat sink.

This can be accomplished directly with particular advantage by the operation monitoring device detecting the flow rate of the coolant through the heat sink with a flowmeter.

A particularly favorable solution allowing the operational quantity to be determined with a high degree of precision provides for the operation monitoring device to determine a thermal quantity representing the thermal output conducted away from the laser diode by the cooling device and enabling the thermal output that is not emitted by the laser diode in the form of radiation to be determined at least approximately.

In principle, when determining the quantity representing the electric current flowing through the laser diode, it is conceivable to detect setting parameters of the power supply from which one can at least indirectly draw conclusions about the electric current flowing through the laser diode.

With a view to determining the operational quantity as precisely as possible, it is, however, particularly expedient, in particular, in order to determine the changes in the operational quantity as exactly as possible, for the operation monitoring device to comprise a current measuring device for determining the electric current flowing through the laser diode.

In the case of a laser diode it can be assumed that the voltage dropping at it will be approximately constant. However, in order to determine the operational quantity with as high a degree of accuracy as possible, provision is preferably made for the operation monitoring device to comprise a voltage measuring device for determining the voltage dropping at the laser diode during operation.

When determining the operational quantity, a particularly high precision is achievable by the operation monitoring device determining an electrical quantity representing the electric power supplied to the laser diode, which constitutes the total electric power supplied to the laser diode.

A particularly high accuracy is achievable in determining the operational quantity when the operation monitoring device determines the operational quantity from the electrical quantity and the thermal quantity.

In addition to the electrical quantity and the thermal quantity, other parameters may be incorporated into the determining of the operational quantity.

It is preferable for the parameters incorporated into the determining of the operational quantity to be selected such that the operational quantity represents the optical output power of the laser diode, so that the operational quantity is a direct measure of the optical output power of the laser diode and therefore directly supplies the most important information for operation of the laser diode.

Regarding the configuration of the diode laser device it has merely been assumed that this comprises one laser diode. However, the solution according to the invention can be utilized with particular advantage when the diode laser device comprises several laser diodes.

In this case, the several laser diodes are preferably fed by a common power supply.

The operational quantity can also be advantageously determined with sufficient precision when the quantity representing the electric current flowing through the entirety of the laser diodes is determined.

A quantity representing the electric current flowing through the totality of the laser diodes and a quantity representing the voltage dropping at the entirety of the laser diodes are therefore preferably incorporated into the electrical quantity, for which purpose the laser diodes are electrically connected in series.

When several laser diodes are provided in the diode laser device, the determining of the quantity representing the temperature of the coolant exiting from the heat sink also focuses on the temperature of the coolant exiting from the totality of the heat sinks.

Coolant preferably flows in parallel through the heat sinks of the several laser diodes so that each of the laser diodes is subjected to substantially the same cooling power.

Details of the design of the cooling device will now be given. It is, for example, conceivable to conduct the coolant exiting from the heat sink or heat sinks away freely. It is, however, particularly advantageous for the cooling device to comprise a cooling circuit from which the heat is conducted away via a heat exchanger.

Details of the way in which the operation monitoring device according to the invention operates will now be given. It is, for example, conceivable to operate the operation monitoring device continuously and to thus determine the operational quantity continuously.

It is, however, sufficient to determine the operational quantity after specified time intervals or after specified operating cycles, as it can usually be assumed that the operational quantity will change only slowly and not necessarily abruptly.

Further features and advantages of the solution according to the invention will be apparent from the following description and the appended drawings of an embodiment.

DETAILED DESCRIPTION OF THE INVENTION

Figure 1:
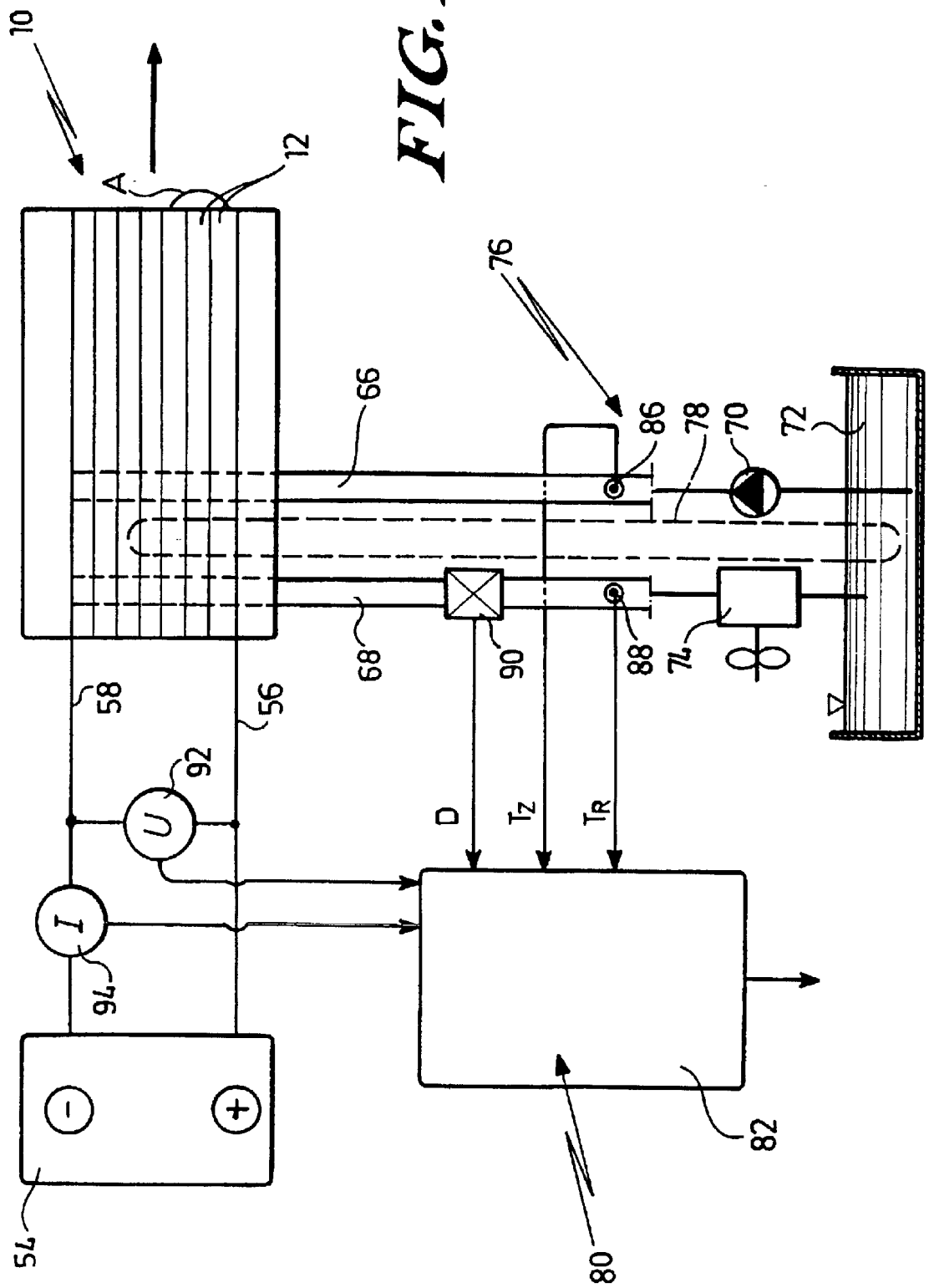
FIG. 1 is a schematic representation of a diode laser device according to the invention.

An embodiment of a diode laser device shown in FIG. 1 comprises a laser diode array generally designated 10 which is formed by a stack of individual laser units 12.

Figure 2:
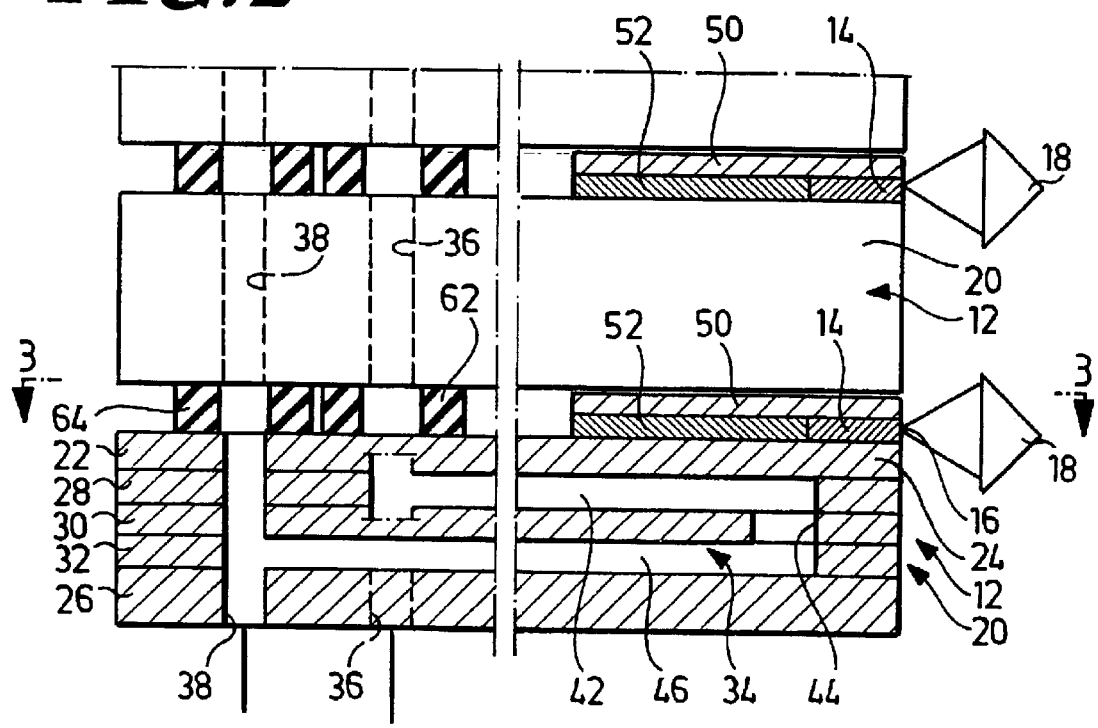
FIG. 2 is an enlarged representation of two superimposed laser units.
Figure 3:
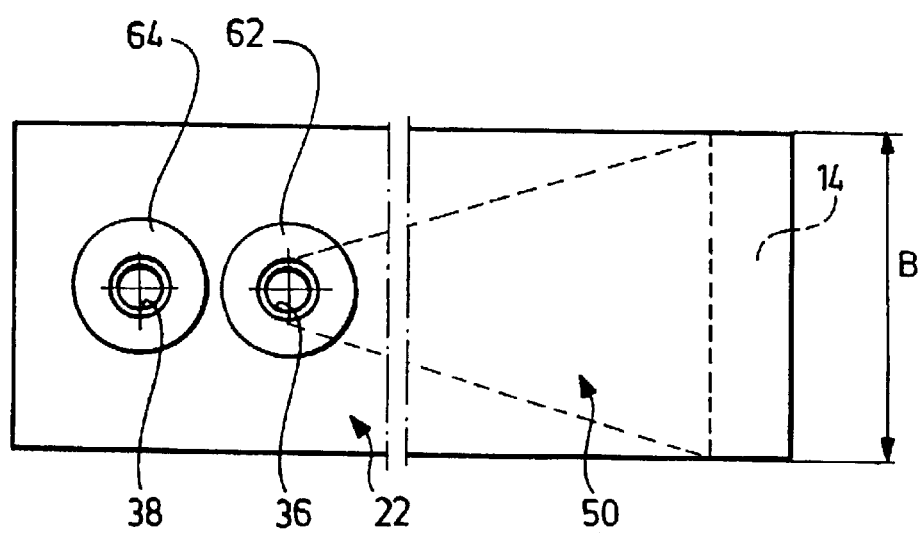
FIG. 3 is a section taken along line 3—3 in FIG. 2.

Each of the individual laser units 12 comprises, as shown in FIG. 2, a laser bar 14 representing a laser diode, from which laser radiation 18 exits at a front side 16 thereof.

The laser bar 14 rests on a heat sink generally designated 20 comprising a cover plate 22 on which the laser bar 14 rests in a front area 24 thereof in thermal contact therewith. The heat sink 20 further comprises a base plate 26 and lying between the cover plate 22 and the base plate 26 intermediate plates 28, 30 and 32. These serve to form in the heat sink 20 a cooling channel system 34 extending between an inflow channel 36 and a return flow channel 38, which penetrate the cover plate 22, the intermediate plates 28 to 32 and the base plate 26 substantially perpendicularly to the area of their extent.

For example, starting from the inflow channel 36, the intermediate plate 28 forms a first cooling channel section 42 of the cooling channel system 34, which cooling channel section 42 extends from the inflow channel 36 beneath the cover plate 22 in the direction of the front area 24 and close to the front area 24 of the cover plate 22 passes via an opening 44 into a second cooling channel section 46 of the cooling channel system 34, which cooling channel section 46 leads from the opening 44 on a side of the cooling channel section 42 that is remote from the cover plate 22 to the return flow channel 38.

Hence, the cover plate 22 can be directly cooled by the coolant entering the cooling channel system 34 via the inflow channel 36, more particularly, as far as into the front area 24 thereof, on which the laser bar 14 rests and into which heat is discharged from the laser bar 14.

The entire heat sink 20 also serves as first connection electrode for the laser bar 14. As second connection electrode 50, a contact plate 50 is disposed on a side of the laser bar 14 that is located opposite the heat sink 20. The contact plate 50 extends over the laser bar 14, more particularly, over the entire width B thereof, and, starting from the laser bar 14, also over part of the area of the cover plate 22 and is thereby supported by the cover plate 22, and an insulator 52 is provided between the contact plate 50 and the heat sink 20.

Hence, the laser bar 14 is electrically contacted, on the one hand, by the heat sink 20 and, on the other hand, by the contact plate 50.

With its heat sink 20 the next laser unit 12 rests on the contact plate 50 in direct electrical contact therewith, so that, seen electrically, all the laser bars 14 of the laser diode array 10 are connected in series, and, for example, a first power supply line 56 leads from a power supply 54 to the heat sink 20 of the lowermost laser unit 12 of the laser diode array 10, while a second power supply line 58 leads from the power supply 54 to the contact plate 50 of the uppermost laser unit 12 of the laser diode array 10.

The inflow channel 36 and the return flow channel 38, which pass through each of the heat sinks 20, are arranged in alignment with each other in all laser units 12, so that the inflow channels 36 and the return flow channels 38 of the entirety of the heat sinks 20 of the laser diode array 10 are interconnectable by annular seals 62 and 64 provided between the individual heat sinks 20. The annular seals 62 and 64 each enclose the outlet openings of the inflow channel 36 and the return flow channel 38 in one heat sink and the inlet openings of the inflow channel 36 and the return flow channel 38 in the other heat sink and thereby establish a connection between the inflow channels 36 of all heat sinks 20 of the laser diode array 10 and the return flow channels 38 of all heat sinks 20 of the laser diode array 10.

Consequently, the cooling channel systems 34 of all heat sinks 20 are supplied in parallel with coolant, and all laser bars 14 of the laser diode array 10 are therefore cooled in the same way.

An inflow line 66 and a return flow line 68 are provided for supplying the laser diode array 10 with coolant. The inflow line 66 and the return flow line 68 lead to the laser diode array 10 and are, for example, connected to the inflow channel 36 and the return flow channel 38 of the heat sink 20 of the lowermost laser unit 12.

Coolant is fed by a pump 70 from a reservoir 72 into the inflow line 66, whereas the heated coolant withdrawn via the return flow line 68 is fed to a cooler 74 which then discharges the cooled coolant into the reservoir 72, from which the pump 70 draws in coolant again.

Therefore, the reservoir 72, the pump 70, the inflow line 66, the entirety of the inflow channels 36 of the laser diode array 10, the entirety of the cooling channel systems 34 in the heat sinks 20 of the laser diode array 10, the entirety of the return flow channels 38 of the laser diode array 10, the return flow line 68 and the cooler 74, which, in turn, leads to the reservoir 72, together form a cooling device generally designated 76 with a cooling circuit 78.

The diode laser device according to the invention is also provided with an operation monitoring unit generally designated 80. The operation monitoring unit 80 comprises an evaluation circuit 82 which is connected to a temperature sensor 86 in the inflow line 66, to a temperature sensor 88 in the return flow line 68 and to a flowmeter 90 in either the inflow line 66 or the return flow line 68 for detecting the amount of coolant flowing through the cooling circuit 78 per time unit.

Hence the evaluation circuit 82 can detect the inflow temperature $T_Z$ by means of the temperature sensor 86, the return flow temperature $T_R$ by means of the temperature sensor 88 and the flow rate D of coolant per time unit through the cooling circuit 78 by means of the flowmeter 90.

The evaluation circuit 82 is also connected to a voltage detection unit 92 for detecting the electrical voltage U applied to the entirety of the laser bars 14 connected in series, and to a current detection unit 94 for detecting the current I flowing from the power supply 54 through the entirety of the laser bars 14 of the laser diode array 10.

Figure 4:
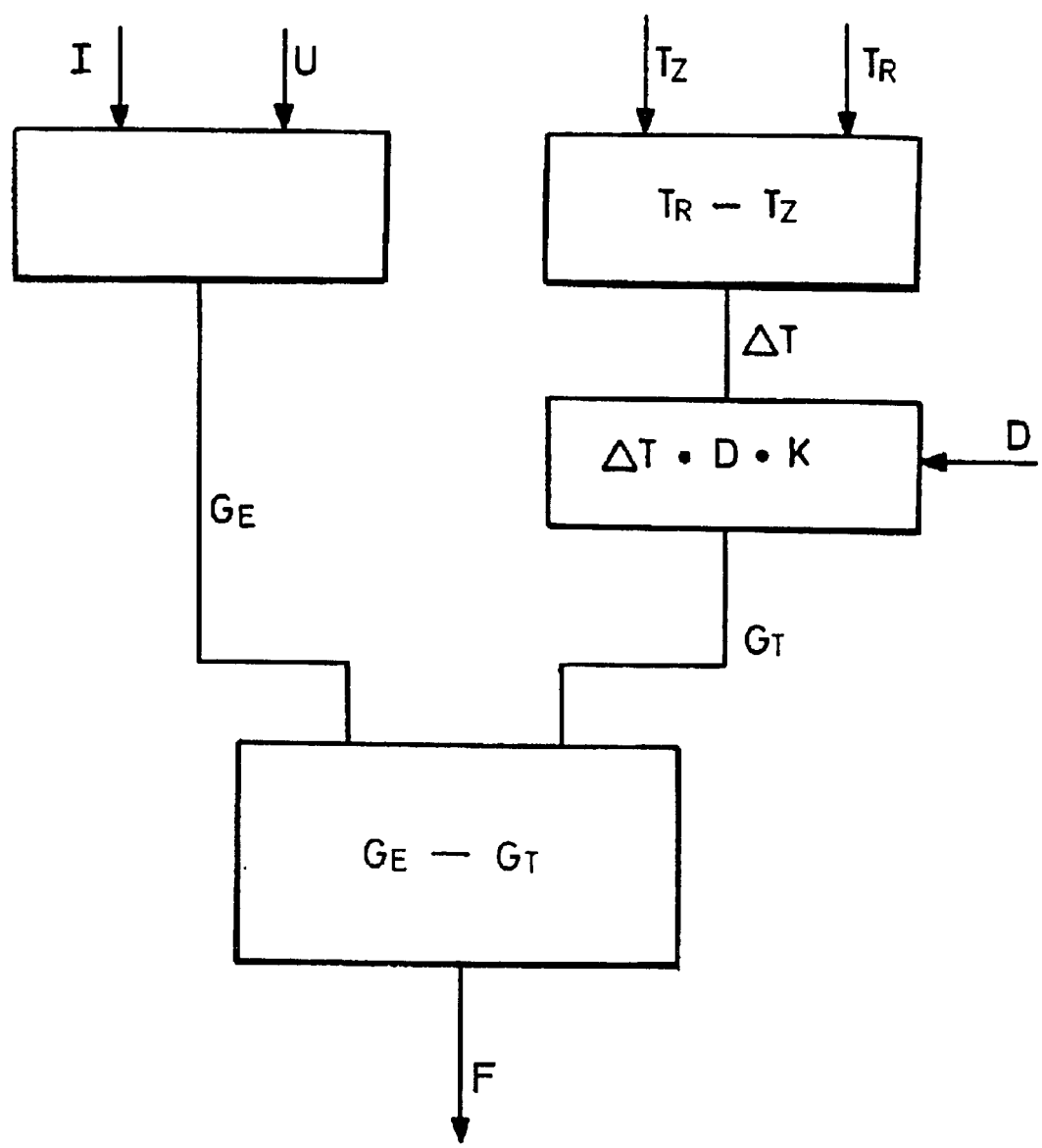
FIG. 4 is a block diagram schematically representing a mode of operation of an operation monitoring device according to the invention.

The evaluation circuit 82 operates, as shown in FIG. 4, for example, by means of a processor, in the manner that the temperature difference $\Delta T$ is first determined from the inflow temperature $T_Z$ and the return flow temperature $T_R$ by subtraction. The temperature difference $\Delta T$ is then multiplied by the flow rate D and a further parameter K to determine a thermal quantity $G_T$, which represents the thermal output dissipated by the cooling device 76. In the simplest case, the parameter K is a constant, but it may be a parameter area which is dependent upon the temperature difference $\Delta T$ and/or the flow rate D.

As shown in FIG. 4, the evaluation circuit 82 also determines from the voltage U at the entirety of the laser bars 14 and the electric current I passing through the entirety of the laser bars 14, by multiplication, an electrical quantity $G_E$ which represents the electric power supplied to the laser diode array 10.

Finally, an operational quantity F representing the optical power emitted by all laser bars 14 is determined by forming the difference between the electrical quantity $G_E$ and the thermal quantity $G_T$.

The operational quantity F makes it possible to monitor operation of the entirety of the laser bars 14 in the laser diode array 10 during use thereof for its intended purpose, for example, for pumping a solid-state laser, and, therefore, to ascertain whether, for example, due to aging of the laser bars 14, the optical power output is decreasing, which is shown by a decrease in the operational quantity F.

What is claimed is:

1. Diode laser device comprising:
   at least one laser diode,
   a power supply for the laser diode,
   a cooling device including a heat sink with the laser diode disposed thereon,
   a coolant supply for allowing a coolant to flow through the heat sink,
   a temperature sensor for detecting a temperature difference in the coolant flowing through the heat sink, and
   an operation monitoring device, the operation monitoring device detecting at least one of:
      (i) a quantity representing the electric current flowing through the laser diode,
      (ii) a quantity representing the voltage across the laser diode,
   said operation monitoring device using at least one of said quantities and using a quantity indicative of said temperature difference, in order to determine an optical output power for determining proper operation of the diode laser device.

2. Diode laser device in accordance with claim 1, wherein the temperature sensor detects the temperature of the coolant exiting from the heat sink.

3. Diode laser device in accordance with claim 1, wherein said temperature difference comprises the temperature difference between the coolant entering the heat sink and the coolant exiting from the heat sink.

4. Diode laser device in accordance with claim 3, wherein the temperature sensor detects the temperature of the coolant entering the heat sink.

5. Diode laser device in accordance with claim 1, wherein the operation monitoring device determines a quantity representing the flow rate of the coolant through the heat sink.

6. Diode laser device in accordance with claim 5, wherein the operation monitoring device determines the quantity representing the flow rate of the coolant through the heat sink with a flowmeter.

7. Diode laser device in accordance with claim 1, wherein the operation monitoring device determines a thermal quantity representing the thermal output conducted away from the laser diode by the cooling device.

8. Diode laser device in accordance with claim 1, wherein the operation monitoring device comprises a current measuring device for detecting the electric current flowing into the laser diode.

9. Diode laser device in accordance with claim 1, wherein the operation monitoring device determines a quantity representing the electric voltage dropping at the laser diode.

10. Diode laser device in accordance with claim 9, wherein the operation monitoring device comprises a voltage measuring device for detecting the electric voltage dropping at the laser diode.

11. Diode laser device in accordance with claim 1, wherein the operation monitoring device determines an electrical quantity representing the electric power supplied to the laser diode.

12. Diode laser device in accordance with claim 1, wherein the diode laser device comprises several laser diodes.

13. Diode laser device in accordance with claim 12, wherein the several laser diodes are electrically connected in series, and wherein the operation monitoring device detects the electric current flowing through all the laser diodes.

14. Diode laser device in accordance with claim 12, wherein the operation monitoring device detects the electric voltage dropping at all the laser diodes electrically connected in series.

15. Diode laser device in accordance with claim 12, wherein the coolant flows in parallel through heat sinks of the several laser diodes.

16. Diode laser device in accordance with claim 1, wherein the cooling device comprises a cooling circuit for the coolant.

17. Diode laser device comprising:

at least one laser diode, a power supply for the laser diode, a cooling device including a heat sink with the laser diode disposed thereon, a coolant supply for allowing a coolant to flow through the heat sink, a temperature sensor for detecting a temperature of the coolant exiting the heat sink, and an operation monitoring device, the operation monitoring device detecting an electrically derived quantity representing the power supplied to the laser diode, said operation monitoring device computing the difference between the detected electrically derived quantity and a thermally derived quantity indicative of a difference in temperature between coolant entering and coolant exiting from the heat sink, wherein the computed difference between the electrically and thermally derived quantities is indicative of an optical output power of the diode laser device.

18. Diode laser device comprising:

at least one laser diode, a power supply for the laser diode, cooling device including a heat sink with the laser diode disposed thereon, a coolant supply for allowing a coolant to flow through the heat sink, at least one temperature sensor for detecting a temperature difference in the coolant flowing through the heat sink, and an operation monitoring device, the operation monitoring device detecting an electrical quantity representing the power supplied to the laser diode, said operation monitoring device using the detected electrical quantity and a thermal quantity indicative of said temperature difference, in order to determine an optical output power for determining proper operation of the diode laser device.

* * * * *